United States Patent
Nakano et al.

(10) Patent No.: US 10,010,980 B2
(45) Date of Patent: *Jul. 3, 2018

(54) SOLDER PASTE, JOINING METHOD USING THE SAME AND JOINED STRUCTURE

(71) Applicant: Murata Manufacturing Co., Ltd., Nagaokakyo-shi, Kyoto-fu (JP)

(72) Inventors: Kosuke Nakano, Nagaokakyo (JP); Hidekiyo Takaoka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 395 days.

This patent is subject to a terminal disclaimer.

(21) Appl. No.: 14/697,717

(22) Filed: Apr. 28, 2015

(65) Prior Publication Data

US 2015/0239069 A1 Aug. 27, 2015

Related U.S. Application Data

(63) Continuation of application No. 13/404,395, filed on Feb. 24, 2012, now Pat. No. 9,044,816, which is a
(Continued)

(30) Foreign Application Priority Data

Sep. 3, 2009 (JP) .................................. 2009-203611

(51) Int. Cl.
*B23K 35/02* (2006.01)
*B23K 1/00* (2006.01)
(Continued)

(52) U.S. Cl.
CPC .............. *B23K 35/025* (2013.01); *B23K 1/00* (2013.01); *B23K 1/0016* (2013.01);
(Continued)

(58) Field of Classification Search
CPC .............. H01L 2924/0105; B23K 1/00; H05K 2201/0215; H05K 3/3484; Y01T 403/479
(Continued)

(56) References Cited

U.S. PATENT DOCUMENTS 9,044,816 B2 * 6/2015 Nakano ................. B23K 1/0016
2002/0046627 A1 * 4/2002 Amita ................. B23K 35/0244
75/252

(Continued)

FOREIGN PATENT DOCUMENTS

CN 1887500 A 1/2007
JP 2002-254194 A 9/2002
(Continued)

OTHER PUBLICATIONS

PCT/JP2010/063681 Written Opinion dated Feb. 11, 2010.
(Continued)

*Primary Examiner* — Jie Yang
(74) *Attorney, Agent, or Firm* — Arent Fox LLP

(57) ABSTRACT

A solder paste including a metal component consisting of a first metal powder and a second metal powder having a melting point higher than that of the first metal, and a flux component. The first metal is Sn or an alloy containing Sn, the second metal is one of (1) a Cu—Mn alloy in which a ratio of Mn to the second metal is 5 to 30% by weight and (2) a Cu—Ni alloy in which a ratio of Ni to the second metal is 5 to 20% by weight, and a ratio of the second metal to the metal component is 36.9% by volume or greater.

12 Claims, 2 Drawing Sheets

Related U.S. Application Data continuation of application No. PCT/JP2010/063681, filed on Aug. 12, 2010.

(51) Int. Cl.

| | |
|---|---|
| *B23K 35/26* | (2006.01) |
| *C22C 9/05* | (2006.01) |
| *C22C 9/06* | (2006.01) |
| *C22C 13/00* | (2006.01) |
| *H01L 23/00* | (2006.01) |
| *H05K 3/34* | (2006.01) |
| *B23K 35/36* | (2006.01) |
| *B23K 35/362* | (2006.01) |
| *B23K 101/40* | (2006.01) |

(52) U.S. Cl.
CPC .......... *B23K 35/262* (2013.01); *B23K 35/362* (2013.01); *B23K 35/3613* (2013.01); *C22C 9/05* (2013.01); *C22C 9/06* (2013.01); *C22C 13/00* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H05K 3/3484* (2013.01); *B23K 2201/40* (2013.01); *H01L 24/05* (2013.01); *H01L 24/11* (2013.01); *H01L 24/27* (2013.01); *H01L 2224/0401* (2013.01); *H01L 2224/04026* (2013.01); *H01L 2224/05155* (2013.01); *H01L 2224/05644* (2013.01); *H01L 2224/1132* (2013.01); *H01L 2224/1329* (2013.01); *H01L 2224/13294* (2013.01); *H01L 2224/13311* (2013.01); *H01L 2224/13347* (2013.01); *H01L 2224/16503* (2013.01); *H01L 2224/16507* (2013.01); *H01L 2224/2732* (2013.01); *H01L 2224/2919* (2013.01); *H01L 2224/2929* (2013.01); *H01L 2224/29101* (2013.01); *H01L 2224/29109* (2013.01); *H01L 2224/29111* (2013.01); *H01L 2224/29294* (2013.01); *H01L 2224/29311* (2013.01); *H01L 2224/29347* (2013.01); *H01L 2224/32503* (2013.01); *H01L 2224/32507* (2013.01); *H01L 2224/81192* (2013.01); *H01L 2224/81211* (2013.01); *H01L 2224/81447* (2013.01); *H01L 2224/81815* (2013.01); *H01L 2224/83192* (2013.01); *H01L 2224/83211* (2013.01); *H01L 2224/83447* (2013.01); *H01L 2224/83815* (2013.01); *H01L 2924/0103* (2013.01); *H01L 2924/0104* (2013.01); *H01L 2924/014* (2013.01); *H01L 2924/01004* (2013.01); *H01L 2924/0105* (2013.01); *H01L 2924/01005* (2013.01); *H01L 2924/01006* (2013.01); *H01L 2924/01012* (2013.01); *H01L 2924/01013* (2013.01); *H01L 2924/01023* (2013.01); *H01L 2924/01024* (2013.01); *H01L 2924/01025* (2013.01); *H01L 2924/01029* (2013.01); *H01L 2924/01032* (2013.01); *H01L 2924/0132* (2013.01); *H01L 2924/0133* (2013.01); *H01L 2924/01033* (2013.01); *H01L 2924/01038* (2013.01); *H01L 2924/01047* (2013.01); *H01L 2924/01049* (2013.01); *H01L 2924/01051* (2013.01); *H01L 2924/01052* (2013.01); *H01L 2924/01057* (2013.01); *H01L 2924/01059* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/01327* (2013.01); *H01L 2924/0665* (2013.01); *H05K 2201/0215* (2013.01); *H05K 2201/0272* (2013.01); *Y10T 403/479* (2015.01); *Y10T 428/31678* (2015.04)

(58) Field of Classification Search
USPC .......................................................... 148/24
See application file for complete search history.

(56) References Cited

U.S. PATENT DOCUMENTS

| | | | |
|---|---|---|---|
| 2002/0114726 | A1 | 8/2002 | Soga et al. |
| 2009/0220812 | A1 | 9/2009 | Kato et al. |
| 2009/0301607 | A1 | 12/2009 | Nakano et al. |
| 2010/0291399 | A1 | 11/2010 | Kato et al. |

FOREIGN PATENT DOCUMENTS

| | | | |
|---|---|---|---|
| JP | 2002-254195 | A | 9/2002 |
| JP | 2003-094193 | A | 4/2003 |
| JP | 2003-211289 | A | 7/2003 |
| TW | 457161 | B | 10/2001 |
| TW | 200732082 | | 9/2007 |
| WO | WO-2007-125861 | A1 | 11/2007 |
| WO | WO-2008-026761 | A1 | 3/2008 |

OTHER PUBLICATIONS

PCT/JP2010/063681 International Search Report dated Feb. 11, 2010.
Taiwan Office Action issued for corresponding patent application 0991129327, dated Oct. 18, 2012 (with English translation).

* cited by examiner

SOLDER PASTE, JOINING METHOD USING THE SAME AND JOINED STRUCTURE

CROSS REFERENCE TO RELATED APPLICATIONS

The present application is a continuation of application Ser. No. 13/404,395, filed Feb. 24, 2012, now U.S. Pat. No. 9,044,816, which is a continuation of International application No. PCT/JP2010/063681, filed Aug. 12, 2010, which claims priority to Japanese Patent Application No. 2009-203611, filed Sep. 3, 2009, the entire contents of each of which are incorporated herein by reference.

FIELD OF THE INVENTION

The present invention relates to a solder paste, a joining method using the same and a joined structure, and particularly to a solder paste that is used for mounting electronic components and the like for example, and a joining method using the same and a joined structure.

BACKGROUND OF THE INVENTION

As a joining material used for mounting electronic components, solder (solder paste) is widely used.

For Sn—Pb-based solder which has been widely used, methods of bonding with temperature hierarchy are widely applied in which high-temperature solder, for example Pb rich Pb-5Sn (melting point: 314 to 310° C.) or Pb-10Sn (melting point: 302 to 275° C.) is used to solder at a temperature of 330 to 350° C., following by using low-temperature solder, for example an Sn-37Pb eutectic crystal (183° C.) to solder at a temperature equal to or lower than the melting point of the high-temperature solder described above, whereby bonding is established by soldering without melting the high-temperature solder used in the preceding soldering.

Such bonding with temperature hierarchy is applied in, for example, a type of semiconductor devices in which a chip is die-bonded and semiconductor devices for flip-chip bonding, and is an important technique which is used in such a case where bonding is established in a semiconductor device, followed by further bonding the semiconductor device itself to a board by soldering.

As a solder paste for use in this application, for example, a solder paste comprising a mixture of (a) a second metal (or alloy) ball consisting of a second metal such as Cu, Al, Au and Ag or a high-melting point alloy containing those metals and (b) a first metal ball consisting of Sn or In has been proposed (see Patent Document 1).

Patent Document 1 also discloses a joining method using a solder paste and a method of producing electronic equipment.

When soldering using the solder paste of Patent Document 1, a solder paste containing low-melting point metal (e.g. Sn) balls 51, high-melting point metal (e.g. Cu) balls 52 and a flux 53 as schematically shown in FIG. 3 (a) is heated and thereby reacted and after soldering, a plurality of high-melting point metal balls 52 are connected together via an intermetallic compound 54 formed between a low-melting point metal derived from the low-melting point metal ball and a high-melting point metal derived from the high-melting point metal ball as shown in FIG. 3 (b), and an object to be joined is bonded/connected (soldered) by this connected body.

In the case of the solder paste of Patent document 1, however, a solder paste is heated in a soldering step to thereby generate an intermetallic compound of a high-melting point metal (e.g. Cu) and a low-melting point metal (e.g. Sn), but a combination of Cu (high-melting point metal) and Sn (low-melting point metal) has a low diffusion rate, so that Sn, a low-melting point metal, remains. A solder paste in which Sn remains may suffer a considerable reduction in bonding strength under a high temperature, and become unusable for some kinds of products to be joined. Furthermore, Sn remaining in the soldering step may be molten to run off in a subsequent soldering step, thus raising a problem of low reliability as high-temperature solder for use in bonding with temperature hierarchy.

That is, for example, if a semiconductor device is produced through a soldering step in a process of producing a semiconductor device, and thereafter the semiconductor device is mounted on a board by a method of reflow soldering, Sn remaining in the soldering step in the process of producing a semiconductor device may be molten to run off in the reflow soldering step.

For forming a low-melting point metal fully into an intermetallic compound so that Sn does not remain, heating at a high temperature and for a long time is required in the soldering step, but it is actually practically impossible in view of productivity.

Patent Document 1: Japanese Patent Application Laid-Open No. 2002-254194

SUMMARY OF THE INVENTION

The present invention solves the problem described above, and an object thereof is to provide a solder paste having a first metal and a second metal whose diffusibility in a soldering step is so good that a high-melting point intermetallic compound is generated at a low temperature and in short time, leaving almost none of a low-melting point components after soldering and having excellent strength in high temperature, and a joining method and a joined structure with high bonding reliability using the same.

For solving the problem described above, the solder paste of the present invention is a solder paste comprising a metal component consisting of a first metal and a second metal having a melting point higher than that of the first metal, and a flux component, wherein the first metal is one of Sn and an alloy containing Sn, and the second metal is one of a metal and alloy which forms an intermetallic compound showing a melting point of 310° C. or higher with the first metal and has a lattice constant difference, i.e. a difference in between the lattice constant of the intermetallic compound and the lattice constant of the second metal component, of 50% or greater.

The ratio of the second metal to the metal component is preferably 30% by volume or greater.

The first metal is preferably one of Sn alone and an alloy containing at least one material selected from the group consisting of Cu, Ni, Ag, Au, Sb, Zn, Bi, In, Ge, Al, Co, Mn, Fe, Cr, Mg, Mn, Pd, Si, Sr, Te and P and Sn.

The second metal is preferably one of a Cu—Mn alloy and a Cu—Ni alloy.

The second metal is preferably one of a Cu—Mn alloy in which the ratio of Mn to the second metal is 10 to 15% by weight and a Cu—Ni alloy in which the ratio of Ni to the second metal is 10 to 15% by weight.

The second metal preferably has a specific surface area of 0.05 m$^2$·g$^{-1}$ or greater.

At least a portion of the first metal is preferably coated on the circumference of the second metal.

The flux preferably contains at least one material selected from the group consisting of: (a) at least one rosin selected from a rosin group consisting of a rosin, a polymerized rosin, a WW (water white) rosin and a hydrogenated rosin; (b) a rosin-based resin containing a derivative of at least one material selected from the rosin group; and (c) a pasty matter obtained by dissolving a solid component such as a thixotropic agent such as hardened castor oil and aliphatic amide or an activator such as an organic acid and a halide acid salt of amine with at least one solvent selected from the group consisting of ethylene glycol monobutyl ether, diethylene glycol monoethyl ether and diethylene glycol monobutyl ether.

The flux preferably contains one of at least one material selected from the thermosetting resin group consisting of an epoxy resin, a phenol resin, a polyimide resin, a silicon resin, a derivative of the silicon resin, and an acryl resin, and at least one material selected from the thermoplastic resin group consisting of a polyamide resin, a polystyrene resin, a polymethacryl resin, a polycarbonate resin and a cellulose resin.

The joining method of the present invention is a method of joining an object to be joined using a solder paste, wherein using the solder paste according to any of claims 1 to 9, all of the first metal constituting the solder paste is formed into an intermetallic compound with the second metal constituting the solder paste by heating to join the object to be joined.

The joined structure of the present invention is a joined structure in which an object to be joined is joined using the solder paste according to any of claims 1 to 9, wherein a joint, through which the object to be joined is joined, has as main components the second metal derived from the solder paste and an intermetallic compound containing the second metal and Sn, and represents 30% by volume or less of the entire metal component of the first metal derived from the solder paste.

In the joined structure of the present invention, the intermetallic compound is preferably an intermetallic compound formed between one of a Cu—Mn alloy and Cu—Ni alloy, which is the second metal derived from the solder paste, and one of Sn alone and an alloy containing at least one material selected from the group consisting of Cu, Ni, Ag, Au, Sb, Zn, Bi, In, Ge, Al, Co, Mn, Fe, Cr, Mg, Mn, Pd, Si, Sr, Te and P and Sn, which is the first metal derived from the solder paste.

The solder paste of the present invention is a solder paste comprising a metal component consisting of a first metal and a second metal having a melting point higher than that of the first metal, and a flux component, wherein the solder paste contains, as a first metal, one of Sn and an alloy containing Sn and contains, as a second metal, one of a metal and alloy which forms with the first metal an intermetallic compound showing a melting point of 310° C. or higher and in which the lattice difference between itself and the intermetallic compound is 50% or greater, so that diffusion of the first metal and the second metal rapidly proceeds, their change into an intermetallic compound having a higher melting point is facilitated and no low-melting point components remain, thus making it possible to solder with increased strength in high temperature.

That is, for example, by using the solder paste of the present invention, when a semiconductor device is produced through a soldering step in a process of producing a semiconductor device, and thereafter the semiconductor device is mounted on a board by a method of reflow soldering, the soldered part in the previous soldering step has excellent strength in high temperature and therefore is not remelted in the reflow soldering step, thus making it possible to mount the semiconductor device on the board with high reliability.

In the present invention, "lattice constant difference" is defined as a value (%) determined by subtracting the lattice constant of the second metal component from the lattice constant of the intermetallic compound and dividing the obtained value by the lattice constant of the second metal component, followed by multiplying an absolute value of the obtained value by 100.

That is, the lattice constant difference shows a difference between the lattice constant of an intermetallic compound newly generated at the interface with the second metal and the lattice constant of the second metal, and does not consider which lattice constant is greater.

The lattice constant difference is expressed by the following calculation formula:

Lattice constant difference={(Lattice constant of intermetallic compound−Lattice constant of second metal)/Lattice constant of second metal}×100.

BRIEF EXPLANATION OF THE DRAWINGS

FIGS. 1(a) to 1(c) are views schematically showing behaviors when the solder paste of the present invention is used to establish bonding, wherein FIG. 1(a) shows a situation before heating, FIG. 1(b) shows a situation in which heating is started and a first metal is molten, and FIG. 1(c) shows a situation in which heating is further continued and all of the first metal forms an intermetallic compound with a second metal.

FIGS. 3(a) and 3(b) are views showing behaviors of solder when a conventional solder paste is used to solder, wherein FIG. 3(a) shows a situation before heating and FIG. 3(b) shows a situation after completion of a soldering step.

DETAILED DESCRIPTION OF THE INVENTION

FIGS. 1(a) to 1(c) are views schematically showing a behavior when soldering is carried out using the solder paste of the present invention.

When a pair of electrodes 11a and 11b are joined using the solder paste of the present invention as shown in FIG. 1(a), a solder paste 10 is first placed between a pair of electrodes 11a and 11b.

Next, the soldered part is heated in this state, and when the temperature of the solder paste 10 reaches the melting point of a first metal (Sn or alloy containing Sn) 1 or higher, the first metal 1 in the solder paste 10 is molten.

Figure 1:
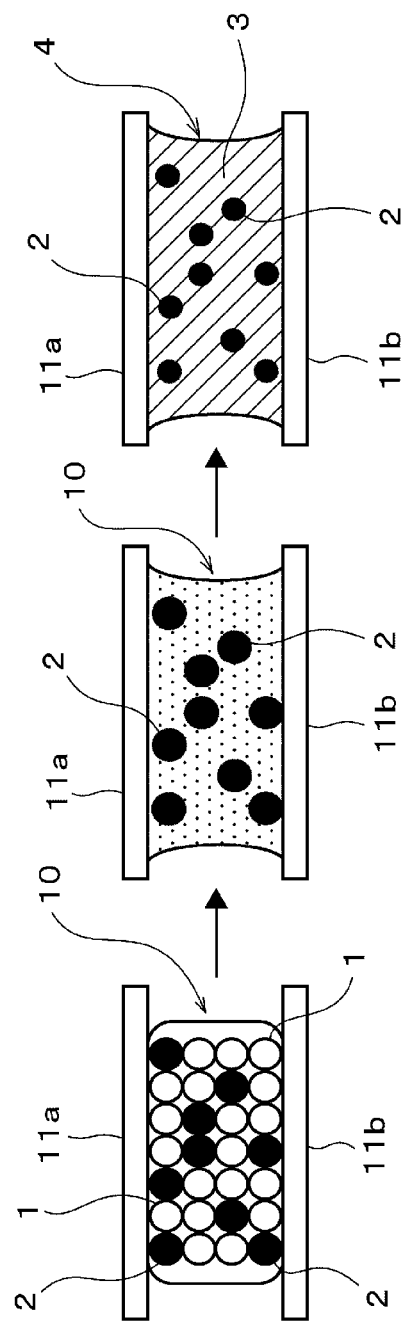

Thereafter, heating further continues, and the first metal 1 forms an intermetallic compound 3 with a second metal 2 (FIG. 1 (c)). Since the solder paste 10 of the present invention has a large lattice constant difference between the intermetallic compound 3 generated at the interface between the first metal 1 and the second metal 2 and the second metal 2 (i.e. the lattice constant difference between the second metal 2 and the intermetallic compound 3 is 50% or greater), the intermetallic compound is repeatedly reacted while separating and diffusing in the molten first metal, generation of the intermetallic compound rapidly proceeds and the content of the first metal 1 can be rapidly reduced in short time sufficiently (FIG. 1(a), 1(b)). Further, by optimizing the composition ratio of the first metal 1 and the second metal 2, all the first metal 1 can be formed into the intermetallic compound as shown in FIG. 1(c) (see FIG. 1(c)).

As a result, soldering with increased strength in high temperature is possible.

By ensuring that the ratio of the second metal to the metal component consisting of the first metal and the second metal is 30% by volume or greater, the ratio of remaining Sn in the soldering step can be further reduced to further improve heat resistance.

By using, as the first metal, Sn alone or an alloy containing at least one material selected from the group consisting of Cu, Ni, Ag, Au, Sb, Zn, Bi, In, Ge, Al, Co, Mn, Fe, Cr, Mg, Mn, Pd, Si, Sr, Te and P and Sn, the intermetallic compound can be easily formed with the other metal (second metal), and the present invention can be made more effective.

By using, as the second metal, a Cu—Mn alloy or a Cu—Ni alloy, particularly a Cu—Mn alloy with the ratio of Mn of 10 to 15% by weight or a Cu—Ni alloy with the ratio of Ni of 10 to 15% by weight, the intermetallic compound can be easily formed with the first metal at a lower temperature and in shorter time, and prevented from being molten in a subsequent reflow step.

The second metal may contain impurities at a level in which the reaction with the first metal is not hindered, for example, at a ratio of 1% by weight or less. Examples of the impurities include Zn, Ge, Ti, Sn, Al, Be, Sb, In, Ga, Si, Ag, Mg, La, P, Pr, Th, Zr, B, Pd, Pt, Ni and Au.

When considering joining characteristics and reactivity, the concentration of oxygen in the first and second metals is preferably 2000 ppm or less, especially preferably 10 to 1000 ppm.

By using, as the second metal, one having a specific surface area of 0.05 $m^2 \cdot g^{-1}$ or greater, the probability of contact with the first metal increases, so that the intermetallic compound can be further easily formed with the first metal, thus making it possible to complete melting point elevation with a common reflow profile.

By coating at least a portion of the first metal powder on the circumference of the second metal powder, the intermetallic compound can be further easily formed between the first metal and the second metal, and the present invention can be made more effective.

For the solder paste of the present invention, various kinds of well-known materials including a vehicle, a solvent, a thixotropic agent, an activator or the like can be used as a flux.

Specific examples of the vehicle include rosin-based resins and synthetic resins consisting of a rosin and a derivative such as a modified rosin obtained by modifying the rosin, or mixtures thereof.

Specific examples of the rosin-based resin consisting of a resin and a derivative such as a modified rosin obtained by modifying the rosin include gum rosins, tall rosins, wood rosins, polymerized rosins, hydrogenated rosins, formylated rosins, rosin esters, rosin modified maleic resins, rosin modified phenol resins, rosin modified alkyd resins and various kinds of other rosin derivatives.

Specific examples of the synthetic resin consisting of a resin and a derivative such as a modified rosin obtained by modifying the rosin include polyester resins, polyamide resins, phenoxy resins and terpen resins.

As the solvent, alcohols, ketones, esters, ethers aromatics, hydrocarbons and the like are known, and specific examples include benzyl alcohol, ethanol, isopropyl alcohol, butanol, diethylene glycol, ethylene glycol, ethyl cellosolve, butyl cellosolve, ethyl acetate, butyl acetate, butyl benzoate, diethyl adipate, dodecane, tetracene, α-terpineol, terpineol, 2-methyl 2,4-pentanediol, 2-ethyl hexanediol, toluene, xylene, propylene glycol monophenyl ether, diethylene glycol monohexyl ether, ethylene glycol monobutyl ether, diethylene glycol monobutyl ether, diisobutyl adipate, hexylene glycol, cyclohexane dimethanol, 2-terpinyloxy ethanol, 2-dihydroterpinyloxy ethanol and mixtures thereof.

Specific examples of the thixotropic agent include hardened castor oil, carnauba wax, amides, hydroxy fatty acids, dibenzylidene sorbitol, bis(p-methylbenzylidene)sorbitols, bees wax, amide stearate and ethylenebisamide hydroxystearate. Materials obtained by adding to the above-mentioned substances, a fatty acid such as caprylic acid, lauric acid, myristic acid, palmitic acid, stearic acid and behenic acid, a hydroxy fatty acid such as 1,2-hydroxystearic acid, an antioxidant, a surfactant, an amine and the like as required may also be used as the thixotropic agent.

Examples of the activators include halide acid salts of amine, organic halogen compounds, organic acids, organic amines and polyvalent alcohols, and specific examples of the halide acid salt of amine include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine halide acid salts, and monoethanolamine hydrobromide.

Specific examples of the organic halogen compound include chlorinated paraffin, tetrabromoethane, dibromopropanol, 2,3-dibromo-1,4-butanediol, 2,3-dibromo-2-butene-1,4-diol and tris(2,3-dibromopropyl)isocyanurate.

Specific examples of the organic acid include malonic acid, fumaric acid, glycolic acid, citric acid, malic acid, succinic acid, phenylsuccinic acid, maleic acid, salicylic acid, anthranilic acid, glutaric acid, suberic acid, adipic acid, sebacic acid, stearic acid, abietic acid, benzoic acid, trimellitic acid, pyromellitic acid and dodecanoic acid, and specific examples of the organic amine include monoethanolamine, diethanolamine, triethanolamine, tributylamine, aniline and diethylaniline.

Examples of the polyvalent alcohol include erythritol, pyrogallol and ribitol.

For the solder paste of the present invention, the action effect of the present invention can be reliably achieved when using a flux containing at least one material selected from the group consisting of (a) at least one rosin selected from a rosin group consisting of a rosin, a polymerized rosin, a WW (water white) rosin and a hydrogenated rosin, (b) a rosin-based resin containing a derivative of at least one material selected from the rosin group, and (c) a pasty matter obtained by dissolving a solid component such as a thixotropic agent such as hardened castor oil and aliphatic amide or an activator such as an organic acid and a halide acid salt of amine with at least one solvent selected from the group consisting of ethylene glycol monobutyl ether, diethylene glycol monoethyl ether and diethylene glycol monobutyl ether, including other well-known materials.

The action effect of the present invention can also be further reliably achieved when using, as the flux, one containing at least one material selected from the thermosetting resin group consisting of an epoxy resin, a phenol resin, a polyimide resin, a silicon resin, a derivative of the silicon resin, and an acryl resin or at least one material selected from the thermoplastic resin group consisting of a polyamide resin, a polystyrene resin, a polymethacryl resin, a polycarbonate resin and a cellulose resin.

In the joining method of the present invention, using the solder paste of the present invention, a low-melting point metal constituting the solder paste is formed into an intermetallic compound with the second metal constituting solder paste to join an object to be joined, so that diffusion of the first metal and the second metal rapidly proceeds in a soldering step, their change into an intermetallic compound having a higher melting point is facilitated and the ratio of the first metal component to the entire metal component is, for example, 30% by volume or less, thus making it possible to solder with increased strength in high temperature.

Further, by optimizing the metal compounding ratio in the solder paste and the like, the solder paste can be designed such that the first metal component does not remain at all.

That is, for example, by using the solder paste of the present invention, when a semiconductor device is produced through a soldering step in a process of producing a semiconductor device, and thereafter the semiconductor device is mounted on a board by a method of reflow soldering, the soldered part in the previous soldering step has excellent strength in high temperature and therefore is not remelted in the reflow soldering step, thus making it possible to mount the semiconductor device on the board with high reliability.

In the joined structure of the present invention, a joint, where an object to be joined is joined, has as main components the second metal derived from the solder paste and an intermetallic compound containing the second metal and Sn, and represents 30% by volume or less of the entire metal component of the first metal derived from the solder paste, thus making it possible to provide a joined structure with increased strength in high temperature.

The content of the first metal derived from the solder paste in the joint is further preferably 3% by volume or less.

For the joined structure of the present invention, as shown in FIG. 1(c), in a joint (solder) 4, where objects to be joined (electrodes) 11a and 11b are joined, all of the first metal forms an intermetallic compound 3 with the second metal, so that the joint 4 is constituted by the second metal 2 and the intermetallic compound 3 and no first metal 1 remains (FIG. 1(a), 1(b)), thus making it possible to achieve a joined structure with increased strength in high temperature.

When the intermetallic compound is an intermetallic compound formed between a Cu—Mn alloy or Cu—Ni alloy which is the second metal derived from the solder paste and Sn alone or an alloy containing at least one material selected from the group consisting of Cu, Ni, Ag, Au, Sb, Zn, Bi, In, Ge, Al, Co, Mn, Fe, Cr, Mg, Mn, Pd, Si, Sr, Te and P and Sn, which is the first metal derived from the solder paste, a joined structure in which almost no first metal component remains and which has increased strength in high temperature can be provided more reliably.

Examples are shown below to describe features of the present invention further in detail.

Example 1

In this example 1, a solder paste was prepared by mixing a first metal powder, a second metal powder and a flux.

The compounding ratio of the first metal powder and the second metal powder was adjusted so that the volume ratio of the first metal powder/second metal powder was 60/40 (i.e. second metal: 40% by volume).

As the first metal powder, Sn-3Ag-0.5Cu, Sn, Sn-3.5Ag, Sn-0.75Cu, Sn-58Bi, Sn-0.7Cu-0.05Ni, Sn-5Sb, Sn-2Ag-0.5Cu-2Bi, Sn-57Bi-1Ag, Sn-3.5Ag-0.5Bi-8In, Sn-9Zn and Sn-8Zn-3Bi were used as shown in Table 1. The average particle size of the first metal powder was 25 µm.

In writing of each material described above, for example, the digit (3.5) of "Sn-3.5Ag" represents a value in % by weight of a component concerned (Ag in this case), and the same applies to other materials described above and those described below.

As the second metal powder, Cu-10Ni, Cu-10Mn, Cu-12Mn-4Ni, Cu-10Mn-1P, a mixed powder of equal amounts of Cu-10Ni and Cu-10Mn, Cu, and Cu-10Zn were used as shown in Table 1.

The average particle size of the second metal powder was 15 µm.

As the flux, one having a compounding ratio of rosin: 74% by weight, diethylene glycol monobutyl ether: 22% by weight, triethanolamine: 2% by weight and hydrogenated castor oil: 2% by weight was used.

For the compounding ratio of the flux, the ratio of the flux to the entire solder paste was 10% by weight.

The prepared solder paste was printed on an oxygen-free Cu plate having a size of 10 mm×10 mm and a thickness of 0.2 mm using a metal mask. The opening size of the metal mask was 1.5 mm×1.5 mm and the thickness was 100 µm.

Figure 2:
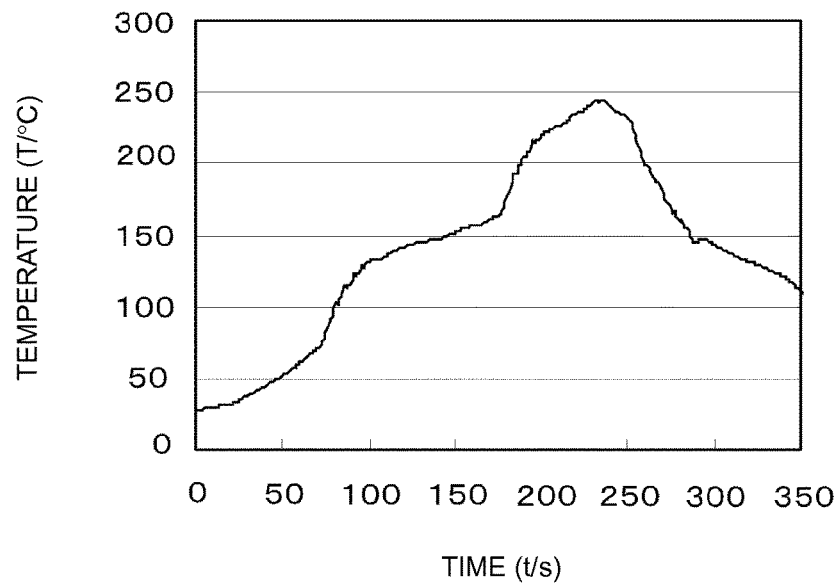
FIG. 2 is a view showing a reflow profile when the solder paste of the present invention is used to mount a brass terminal on an oxygen-free Cu plate.
Figures 3A, 3B:
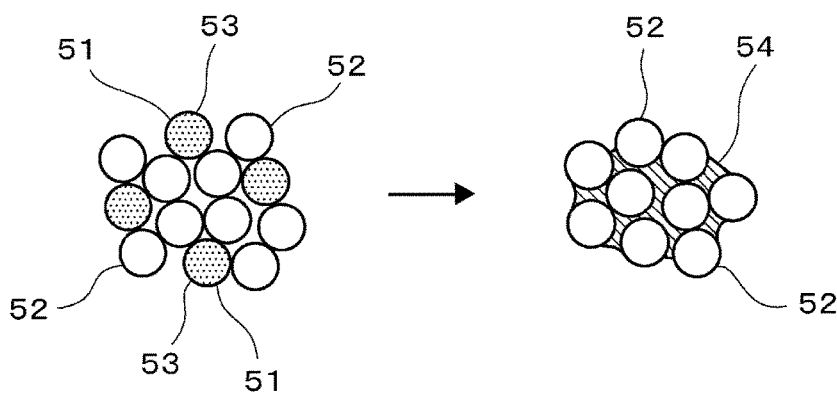

A brass terminal (size: 1.2 mm×1.0 mm×1.0 mm) plated with Ni and plated with Au was mounted on the printed solder paste, followed by using a reflow apparatus to establish bonding with a reflow profile shown in FIG. 2.

[Evaluation of Characteristics]

For samples prepared as described above, the bonding strength and the solder runoff failure occurrence rate were measured to evaluate the characteristics.

<<Bonding Strength>>

The shear strength of the obtained joined body was measured using a bonding tester and evaluated.

Measurements of the shear strength were made at a side push speed of 0.1 mm·s$^{-1}$ at room temperature and 260° C.

Samples having a shear strength of 20 Nmm$^{-2}$ or greater were rated as ⊙ (excellent) and those having a shear strength of 2 Nmm$^{-2}$ or less were rated as X (failure).

Table 1 shows the compositions of the first metal and the second metal, the lattice constant of the second metal, the compounding ratio of the first metal and the second metal, the type and the lattice constant of an intermetallic compound initially generated at the surface of the second metal powder, the lattice constant difference between the second metal (Cu alloy) and the intermetallic compound and the bonding strength of each joined body (room temperature and 260° C.). The lattice constant was evaluated on the basis of the a axis.

<<Evaluation of Remaining Components>>

About 7 mg of the reaction product obtained was cut off and subjected to differential scanning calorimetry (DSC measurement) under conditions of a measurement temperature of 30° C. to 300° C., a temperature rise rate of 5° C./min, $N_2$ atmosphere and a reference of $Al_2O_3$. The amount of remaining first metal component was quantified from the amount of absorbed heat in the melt heat absorption peak at the melt temperature of the first metal component in the DSC chart obtained. Thus, the ratio of the first metal component to the entire metal component was evaluated as a remaining first metal component rate. Samples having a remaining first metal component rate of 0 to 3% by volume were rated as ⊙ (excellent) and those having a remaining first metal component rate greater than 30% by volume were rated as x (failure).

Table 1 shows both the remaining first metal component rate and evaluation results.

<<Solder Runoff>>

A Cu land of a printed board (Cu land size: 0.7 mm×0.4 mm) was coated with the solder paste (thickness of 100 μm) and a chip type ceramic condenser having a length of 1 mm, a width of 0.5 mm and a thickness of 0.5 mm was mounted on the obtained coated part.

After reflow soldering at a peak temperature of 250° C., the printed board was sealed with an epoxy resin, left to stand in an atmosphere with a relative humidity of 85% and heated under reflow conditions at a peak temperature of 260° C. to examine a rate at which solder ran off, and the rate was evaluated as a solder runoff failure occurrence rate.

Samples having a solder runoff failure rate of 0 to 10% were rated as ☉ (excellent) and those having a solder runoff failure rate greater than 50% were rated as X (failure).

Table 1 shows both the solder runoff failure occurrence rate and evaluation results.

For the remaining first metal component rate, Comparative Example had a rate greater than 30% by volume while Examples all had a rate of 0% by volume, and for the solder runoff failure rate, Comparative Example had a rate of 70% or greater while Examples all had a rate of 0% and were found to have high heat resistance.

Samples of Examples were found to have comparable high heat resistance irrespective of the type of the first metal as long as the first metal was a solder alloy based on Sn.

Moreover, samples of Examples were found to have comparably high heat resistance as well when the second metal was a metal based on Cu—Mn (Cu-12Mn-4Ni and Cu-10Mn-1P, etc.) and the second metal powder were of two or more types (Cu—Mn, Cu—Ni mixed powder).

It can be considered that the reason why samples of Examples thus have high heat resistance is that for Examples using Cu—Mn and Cu—Ni based alloys as the second

TABLE 1

| | First metal component (60% by volume) | Second metal component (40% by volume) Composition | Second metal Lattice constant a (nm) | Intermetallic compound generated at interface Composition | Intermetallic compound generated at interface Lattice constant a (nm) | Lattice constant difference between Cu alloy and compound | Evaluation of bonding strength (room temperature) Bonding strength (Nmm$^{-2}$) | Evaluation of bonding strength (room temperature) Evaluation | Evaluation of bonding strength (260° C.) Bonding strength (Nmm$^{-2}$) | Evaluation of bonding strength (260° C.) Evaluation | Evaluation of remaining components Remaining first metal component rate (% by volume) | Evaluation of remaining components Evaluation | Evaluation of runoff Runoff failure rate (%) | Evaluation of runoff Evaluation |
|---|---|---|---|---|---|---|---|---|---|---|---|---|---|---|
| Example | Sn-3Ag-0.5Cu | Cu-10Ni | 0.357 | Cu$_2$NiSn | 0.597 | 67 | 28 | ☉ | 25 | ☉ | 0 | ☉ | 0 | ☉ |
| | | Cu-10Mn | 0.367 | Cu$_2$MnSn | 0.617 | 68 | 28 | ☉ | 24 | ☉ | 0 | ☉ | 0 | ☉ |
| | Sn | Cu-10Mn | 0.367 | Cu$_2$MnSn | 0.617 | 68 | 29 | ☉ | 24 | ☉ | 0 | ☉ | 0 | ☉ |
| | Sn-3.5Ag | Cu-10Mn | 0.367 | Cu$_2$MnSn | 0.617 | 68 | 27 | ☉ | 22 | ☉ | 0 | ☉ | 0 | ☉ |
| | Sn-0.75Cu | Cu-10Mn | 0.367 | Cu$_2$MnSn | 0.617 | 68 | 27 | ☉ | 24 | ☉ | 0 | ☉ | 0 | ☉ |
| | Sn-58Bi | Cu-10Mn | 0.367 | Cu$_2$MnSn | 0.617 | 68 | 27 | ☉ | 26 | ☉ | 0 | ☉ | 0 | ☉ |
| | Sn-0.7Cu-0.05Ni | Cu-10Mn | 0.367 | Cu$_2$MnSn | 0.617 | 68 | 28 | ☉ | 24 | ☉ | 0 | ☉ | 0 | ☉ |
| | Sn-5Sb | Cu-10Mn | 0.367 | Cu$_2$MnSn | 0.617 | 68 | 30 | ☉ | 26 | ☉ | 0 | ☉ | 0 | ☉ |
| | Sn-2Ag-0.5Cu-2Bi | Cu-10Mn | 0.367 | Cu$_2$MnSn | 0.617 | 68 | 29 | ☉ | 26 | ☉ | 0 | ☉ | 0 | ☉ |
| | Sn-57Bi-1Ag | Cu-10Mn | 0.367 | Cu$_2$MnSn | 0.617 | 68 | 29 | ☉ | 25 | ☉ | 0 | ☉ | 0 | ☉ |
| | Sn-3.5Ag-0.5Bi-8In | Cu-10Mn | 0.367 | Cu$_2$MnSn | 0.617 | 68 | 28 | ☉ | 24 | ☉ | 0 | ☉ | 0 | ☉ |
| | Sn-9Zn | Cu-10Mn | 0.367 | Cu$_2$MnSn | 0.617 | 68 | 27 | ☉ | 25 | ☉ | 0 | ☉ | 0 | ☉ |
| | Sn-8Zn-3Bi | Cu-10Mn | 0.367 | Cu$_2$MnSn | 0.617 | 68 | 27 | ☉ | 24 | ☉ | 0 | ☉ | 0 | ☉ |
| | Sn-3Ag-0.5Cu | Cu-12Mn-4Ni | 0.367 | Cu$_2$MnSn | 0.617 | 68 | 28 | ☉ | 23 | ☉ | 0 | ☉ | 0 | ☉ |
| | | Cu-10Mn-1P | 0.367 | Cu$_2$MnSn | 0.617 | 68 | 29 | ☉ | 23 | ☉ | 0 | ☉ | 0 | ☉ |
| | | Cu-10Ni (20% by volume) | 0.352 | Cu$_2$NiSn | 0.597 | 67 | 28 | ☉ | 25 | ☉ | 0 | ☉ | 0 | ☉ |
| | | Cu-10Mn (20% by volume) | 0.367 | Cu$_2$MnSn | 0.617 | 68 | | | | | | | | |
| Comparative Example | Sn-3Ag-0.5Cu | Cu | 0.361 | Cu$_3$Sn | 0.432 | 20 | 25 | ☉ | 0.1 | X | 31 | X | 75 | X |
| | | Cu-10Zn | 0.359 | Cu$_3$Sn | 0.432 | 20 | 31 | ☉ | 1.8 | X | 34 | X | 70 | X |

As shown in Table 1, for the bonding strength at room temperature, both Examples and Comparative Example showed a bonding strength of 20 Nmm$^{-2}$ or greater and were found to have a practical strength.

On the other hand, for the bonding strength at 260° C., Comparative Example had an insufficient bonding strength of 2 Nmm$^{-2}$ or less, while Examples retained a bonding strength of 10 Nmm$^{-2}$ or greater and were found to have a practical strength.

metal, intermetallic compounds are Cu$_2$MnSn and Cu$_2$NiSn, respectively, and the lattice constant difference between each intermetallic compound and the second metal (Cu alloy) is 50% or greater. In other words, it can be considered that this is because if the lattice constant difference between an intermetallic compound layer generated and the second metal which is a base metal is large, the intermetallic compound is repeatedly reacted while separating and diffusing in the molten first metal, and therefore formation of the intermetallic compound rapidly proceeds.

On the other hand, it can be considered that when a Cu or Cu—Zn alloy is used as the second metal as in Comparative Example, the intermetallic compound at the bonding interface is $Cu_3Sn$, the lattice constant difference between the intermetallic compound and the second metal (Cu alloy) is as small as 20%, formation of the intermetallic compound does not efficiently proceed, and therefore high heat resistance cannot be obtained.

Example 2

A powder of Sn-3Ag-0.5Cu was prepared as the first metal powder. The average particle size of the first metal powder was 25 μm.

Powders of Cu and Cu-10Mn were prepared as the second metal powder. The average particle size of the second metal powder was 15 μm.

As the flux, one having a compounding ratio of rosin: 74% by weight, diethylene glycol monobutyl ether: 22% by weight, triethanolamine: 2% by weight and hydrogenated castor oil: 2% by weight was prepared.

A solder paste was prepared by mixing the above-mentioned first metal powder, second metal powder and flux.

The compounding ratio of the first metal powder and the second metal powder was adjusted so that the volume ratio of the first metal powder/second metal powder was 87/13 to 57/43 (i.e. second metal powder: 13 to 43% by volume).

For the compounding ratio of the flux, the ratio of the flux in the entire solder paste was 10% by weight.

For the solder paste thus prepared, the bonding strength and the solder runoff failure occurrence rate were measured to evaluate the characteristics in the same manner as in Example 1.

For evaluation of the bonding strength, samples having a shear strength of 20 $Nmm^{-2}$ or greater were rated as ⊙ (excellent), those having a shear strength greater than 2 $Nmm^{-2}$ and less than 20 $Nmm^{-2}$ were rated as ○ (good) and those having a shear strength of 2 $Nmm^{-2}$ or less were rated as x (failure).

For the remaining first metal component rate, samples having a rate of 0 to 3% by volume were rated as ⊙ (excellent), those having a rate greater than 3% by volume and equal to or less than 30% by volume were rated as ○ (good) and those having a rate greater than 30% by volume were rated as x (failure).

For the solder runoff failure rate, samples having a rate of 0 to 10% were rated as ⊙ (excellent), those having a rate greater than 10% and equal to or less than 50% were rated as ○ (good) and those having a rate greater than 50% were rated as x (failure).

Table 2 shows the bonding strength of each joined body (room temperature, 260° C.), the remaining first metal component rate, the solder runoff failure rate and the evaluation results thereof.

TABLE 2

| | Metal components in solder paste | | | Evaluation of bonding strength (room temperature) | | Evaluation of bonding strength (260° C.) | | Evaluation of remaining components | | | |
|---|---|---|---|---|---|---|---|---|---|---|---|
| | Ratio of first metal component Sn-3Ag-0.5Cu (% by volume) | Ratio of second metal component (% by volume) | | Bonding strength ($Nmm^{-2}$) | Evaluation | Bonding strength ($Nmm^{-2}$) | Evaluation | Remaining first metal component rate (% by volume) | Evaluation | Runoff failure rate (%) | Evaluation |
| Example | 57.1 | Cu-10Mn | 42.9 | 25 | ⊙ | 23 | ⊙ | 0 | ⊙ | 0 | ⊙ |
| | 66.7 | | 33.3 | 28 | ⊙ | 24 | ⊙ | 0 | ⊙ | 0 | ⊙ |
| | 70.0 | | 30.0 | 30 | ⊙ | 26 | ⊙ | 0 | ⊙ | 0 | ⊙ |
| | 72.7 | | 27.3 | 31 | ⊙ | 16 | ○ | 11 | ○ | 11 | ○ |
| | 79.9 | | 20.1 | 29 | ⊙ | 11 | ○ | 16 | ○ | 14 | ○ |
| | 84.2 | | 15.8 | 27 | ⊙ | 9 | ○ | 21 | ○ | 21 | ○ |
| | 86.9 | | 13.1 | 27 | ⊙ | 7 | ○ | 26 | ○ | 49 | ○ |
| | 63.1 | Cu-10Ni | 36.9 | 30 | ⊙ | 27 | ⊙ | 0 | ⊙ | 0 | ⊙ |
| | 70.0 | | 30.0 | 33 | ⊙ | 29 | ⊙ | 0 | ⊙ | 0 | ⊙ |
| | 83.7 | | 16.3 | 27 | ⊙ | 8 | ○ | 23 | ○ | 11 | ○ |
| Comparative Example | 57.1 | Cu | 42.9 | 25 | ⊙ | 0.1 | X | 31 | X | 75 | X |
| | 66.7 | | 33.3 | 25 | ⊙ | 0.1 | X | 40 | X | 71 | X |
| | 72.7 | | 27.3 | 29 | ⊙ | 0.1 | X | 47 | X | 80 | X |
| | 79.9 | | 20.1 | 29 | ⊙ | 0.1 | X | 53 | X | 79 | X |
| | 84.2 | | 15.8 | 30 | ⊙ | 0.1 | X | 60 | X | 81 | X |
| | 86.9 | | 13.1 | 28 | ⊙ | 0.1 | X | 74 | X | 85 | X |

As shown in Table 2, for the bonding strength at room temperature, both Examples and Comparative Examples showed a bonding strength of 20 $Nmm^{-2}$ or greater and were found to have a practical strength.

On the other hand, for the bonding strength at 260° C., Comparative Examples had an insufficient bonding strength of 0.1 $Nmm^{-2}$, far below 2 $Nmm^{-2}$, while Examples retained a bonding strength of 7 to 26 $Nmm^{-2}$, greater than 2 $Nmm^{-2}$, and were found to have a practical strength. Particularly, Examples showed a bonding strength of 23 $Nmm^{-2}$ or greater and were found to have increased strength in high temperature when the second metal was Cu-10Mn and its ratio was 30% or greater.

For the remaining first metal component rate, Comparative Examples had a rate greater than 30% by volume while Examples all had a rate of 30% by volume or less, and Examples had a remaining first metal component rate of 0% by volume when the ratio of Cu-10Mn or Cu-10Ni, i.e. the second metal, was 30% by volume or greater. For the solder runoff failure rate, Comparative Examples had a rate of 70% or greater while Examples all had a rate of 50% or less, and Examples had a solder runoff failure rate of 0% and were found to have high heat resistance when the ratio of Cu-10Mn or Cu-10Ni, i.e. the second metal, was 30% by volume or greater.

Example 3

A powder of Sn-3Ag-0.5Cu was prepared as the first metal powder. The average particle size of the first metal powder was 25 μm.

A powder of a Cu—Mn alloy with the ratio of Mn of 5 to 30% by weight and a powder of a Cu—Ni alloy with the ratio of Ni of 5 to 20% by weight were prepared as the second metal powder. The average particle size of the second metal powder was 15 μm.

As the flux, one having a compounding ratio of rosin: 74% by weight, diethylene glycol monobutyl ether: 22% by weight, triethanolamine: 2% by weight and hydrogenated castor oil: 2% by weight was prepared.

A solder paste was prepared by mixing the above-mentioned first metal powder, second metal powder and flux.

For the compounding ratio of the flux, the ratio of the flux to the entire solder paste was 10% by weight.

The compounding ratio of the first metal powder and the second metal powder was adjusted so that the volume ratio of the first metal powder/second metal powder was 60/40 (i.e. second metal powder: 40% by volume).

For the solder paste thus prepared, the bonding strength, the remaining first metal component rate and the solder runoff failure occurrence rate were measured to evaluate the characteristics in the same manner as in Example 1.

Evaluation of the bonding strength and evaluation of the remaining first metal component rate and the solder runoff failure rate were carried out on the basis of the same criteria as in Example 2.

Table 3 shows the bonding strength of each joined body (room temperature, 260° C.), the remaining first metal component rate, the solder runoff failure rate and the evaluation results thereof.

As shown in Table 3, for the bonding strength at room temperature, both Examples and Comparative Examples showed a bonding strength of 20 $Nmm^{-2}$ or greater and were found to have a practical strength.

On the other hand, for the bonding strength at 260° C., Comparative Examples had an insufficient bonding strength of 0.1 $Nmm^{-2}$, far below 2 $Nmm^{-2}$, while Examples retained a bonding strength of 5 to 26 $Nmm^{-2}$, greater than 2 $Nmm^{-2}$, and were found to have a practical strength. Particularly, Examples showed a high bonding strength of 24 to 26 $Nmm^{-2}$ and were found to have excellent strength in high temperature when the second metal was Cu-10 to 15Mn and when the second metal was Cu-10 to 15Ni.

For the remaining first metal component rate, Comparative Example had a rate greater than 30% by volume while Examples all had a rate of 30% by volume or less, and Examples had a remaining first metal component rate of 0% by volume when the second metal was Cu-10 to 15Mn and when the second metal was Cu-10 to 15Ni. For the solder runoff failure rate, Comparative Example had a rate of 70% or greater while Examples all had a rate of 50% or less, and Examples had a solder runoff failure rate of 0% and were found to have high heat resistance when the second metal was Cu-10 to 15Mn and when the second metal was Cu-10 to 15 Ni.

Example 4

A powder of Sn-3Ag-0.5Cu was prepared as the first metal powder. The average particle size of the first metal powder was 25 μm.

Powders of Cu and a Cu-10Mn alloy were prepared as the second metal powder. The average particle size of the second metal powder was 15 μm. The particle size of the second metal powder was changed so that the specific surface area was 0.03 to 0.06 $m^2 \cdot g^{-1}$.

As the flux, one having a compounding ratio of rosin: 74% by weight, diethylene glycol monobutyl ether: 22% by weight, triethanolamine: 2% by weight and hydrogenated castor oil: 2% by weight was prepared.

A solder paste was prepared by mixing the above-mentioned first metal powder, second metal powder and flux.

TABLE 3

| | First metal component (60% by volume) | Second metal component (40% by volume) | Evaluation of bonding strength (room temperature) | | Evaluation of bonding strength (260° C.) | | Evaluation of remaining components | | Evaluation of runoff | |
|---|---|---|---|---|---|---|---|---|---|---|
| | | | Bonding strength ($Nmm^{-2}$) | Evaluation | Bonding strength ($Nmm^{-2}$) | Evaluation | Remaining first metal component rate (% by volume) | Evaluation | Runoff failure rate (%) | Evaluation |
| Example | Sn-3Ag-0.5Cu | Cu-5Mn | 28 | ⊙ | 6 | ◯ | 19 | ◯ | 32 | ◯ |
| | | Cu-10Mn | 27 | ⊙ | 24 | ⊙ | 0 | ⊙ | 0 | ⊙ |
| | | Cu-15Mn | 28 | ⊙ | 25 | ⊙ | 0 | ⊙ | 0 | ⊙ |
| | | Cu-20Mn | 30 | ⊙ | 12 | ◯ | 9 | ◯ | 15 | ◯ |
| | | Cu-30Mn | 31 | ⊙ | 5 | ◯ | 21 | ◯ | 35 | ◯ |
| | | Cu-5Ni | 28 | ⊙ | 8 | ◯ | 12 | ◯ | 26 | ◯ |
| | | Cu-10Ni | 30 | ⊙ | 26 | ⊙ | 0 | ⊙ | 0 | ⊙ |
| | | Cu-15Ni | 29 | ⊙ | 26 | ⊙ | 0 | ⊙ | 0 | ⊙ |
| | | Cu-20Ni | 30 | ⊙ | 12 | ◯ | 5 | ◯ | 12 | ◯ |
| Comparative Example | | Cu | 31 | ⊙ | 0.1 | X | 31 | X | 75 | X |

For the compounding ratio of the flux, the ratio of the flux to the entire solder paste was 10% by weight.

The compounding ratio of the first metal powder and the second metal powder was adjusted so that the volume ratio of the first metal powder/second metal powder was 60/40 (i.e. second metal powder: 40% by volume).

For the solder paste thus prepared, the bonding strength, the remaining first metal component rate and the solder runoff failure occurrence rate were measured to evaluate the characteristics in the same manner as in Example 1.

Evaluation of the bonding strength and evaluation of the remaining first metal component rate and the solder runoff failure rate were carried out on the basis of the same criteria as in Example 2 described above.

Table 4 shows the bonding strength of each joined body (room temperature, 260° C.), the remaining first metal component rate, the solder runoff failure rate and the evaluation results thereof.

found to have high heat resistance when the specific surface area of Cu-10Mn, i.e. the second metal, was 0.05 $m^2 \cdot g^{-1}$ or greater.

Example 5

A solder paste was prepared by mixing a metal powder of
a mixture of a Sn-plated Cu-10Mn alloy and a Sn powder,
a mixture of a Sn-plated Cu-10Mn alloy, a Sn powder and a Cu-10Mn alloy or
a Sn-plated Cu-10Mn alloy alone,
with a flux.

Except for the case where the Sn-plated Cu-10Mn alloy alone was used, the compounding ratio of the first metal powder and the second metal powder was adjusted so that the volume ratio of the first metal powder/second metal powder was 60/40 (i.e. second metal powder: 40% by volume).

TABLE 4

| | First metal component (60% by volume) | Second metal component (40% by volume) | Specific surface area ($m^2 \cdot g^{-1}$) | Evaluation of bonding strength (room temperature) | | Evaluation of bonding strength (260° C.) | | Evaluation of remaining components | | Evaluation of runoff | |
|---|---|---|---|---|---|---|---|---|---|---|---|
| | | | | | | | | Remaining first metal component | | Runoff | |
| | | | | Bonding strength ($Nmm^{-2}$) | Evaluation | Bonding strength ($Nmm^{-2}$) | Evaluation | rate (% by volume) | Evaluation | failure rate (%) | Evaluation |
| Example | Sn-3Ag-0.5Cu | Cu-10Mn | 0.06 | 29 | ⊙ | 24 | ⊙ | 0 | ⊙ | 0 | ⊙ |
| | | | 0.05 | 31 | ⊙ | 21 | ⊙ | 0 | ⊙ | 0 | ⊙ |
| | | | 0.04 | 25 | ⊙ | 16 | ○ | 6 | ○ | 10 | ○ |
| | | | 0.03 | 28 | ⊙ | 14 | ○ | 9 | ○ | 15 | ○ |
| Comparative Example | | Cu | 0.06 | 31 | ⊙ | 0.1 | X | 31 | X | 75 | X |

As shown in Table 4, for the bonding strength at room temperature, both Examples and Comparative Example showed a bonding strength of 20 $Nmm^{-2}$ or greater and were found to have a practical strength.

On the other hand, for the bonding strength at 260° C., Comparative Example had an insufficient bonding strength of 0.1 $Nmm^{-2}$, far below 2 $Nmm^{-2}$, while Examples retained a bonding strength of 14 to 24 $Nmm^{-2}$, greater than 2 $Nmm^{-2}$, and were found to have a practical strength. Further, Examples showed a bonding strength of 21 $Nmm^{-2}$ or greater and had particularly high strength in high temperature when the specific surface area of Cu-10Mn, i.e. the second metal, was 0.05 $m^2 \cdot g^{-1}$ or greater.

For the remaining first metal component rate, Comparative Example had a rate greater than 30% by volume while Examples all had a rate of 30% by volume or less, and Examples had a remaining first metal component rate of 0% by volume when the specific surface area of Cu-10Mn, i.e. the second metal, was 0.05 $m^2 \cdot g^{-1}$ or greater. For the solder runoff failure rate, Comparative Example had a rate of 70% or greater while Examples all had a rate of 50% or less, and Examples had a solder runoff failure rate of 0% and were However, for the Sn-plated Cu-10Mn alloy alone, the total ratio of the Cu—Mn alloy (second metal) was 80%.

As the flux, one having a compounding ratio of rosin: 74% by weight, diethylene glycol monobutyl ether: 22% by weight, triethanolamine: 2% by weight and hydrogenated castor oil: 2% by weight was used.

For the compounding ratio of the flux, the ratio of the flux to the entire solder paste was 10% by weight.

For the solder paste thus prepared, the bonding strength, the remaining first metal component rate and the solder runoff failure occurrence rate were measured to evaluate the characteristics in the same manner as in Example 1.

Evaluation of the bonding strength, the remaining first metal component rate and the solder runoff failure rate was carried out on the basis of the same criteria as in Example 2 described above.

Table 5 shows the bonding strength of each joined body (room temperature, 260° C.), the remaining first metal component rate, the solder runoff failure rate and the evaluation results thereof.

TABLE 5

| | Powder consisting of first metal component | Powder consisting of second metal coated with first metal component | Powder consisting of second metal component | Total amount (% by volume) of first metal component | Total amount (% by volume) of second metal component | Evaluation of bonding strength (room temperature) Bonding strength (Nmm$^{-2}$) | Eval- uation | Evaluation of bonding strength (260° C.) Bonding strength (Nmm$^{-2}$) | Eval- uation | Evaluation of remaining components Remaining first metal component rate (% by volume) | Eval- uation | Evaluation of runoff Runoff failure rate (%) | Eval- uation |
|---|---|---|---|---|---|---|---|---|---|---|---|---|---|
| Example | Sn | Cn-coated Cu-10Mn | — | 60 | 40 | 27 | ⊙ | 24 | ⊙ | 0 | ⊙ | 0 | ⊙ |
| | Sn | Cn-coated Cu-10Mn | Cu-10Mn | | | 29 | ⊙ | 24 | ⊙ | 0 | ⊙ | 0 | ⊙ |
| | — | Cn-coated Cu-10Mn | — | 20 | 80 | 27 | ⊙ | 26 | ⊙ | 0 | ⊙ | 0 | ⊙ |
| Comparative Example | Sn | Sn-coated Cu | — | 60 | 40 | 28 | ⊙ | 0.1 | X | 31 | X | 71 | X |
| | Sn | Sn-coated Cu | Cu | | | 25 | ⊙ | 0.1 | X | 39 | X | 77 | X |
| | — | Sn-coated Cu | — | 20 | 80 | 28 | ⊙ | 0.1 | X | 43 | X | 84 | X |

As shown in Table 5, for the bonding strength at room temperature, both Examples and Comparative Examples showed a bonding strength of 20 Nmm$^{-2}$ or greater and were found to have a practical strength.

On the other hand, for the bonding strength at 260° C., Comparative Examples had an insufficient bonding strength of 0.1 Nmm$^{-2}$, far below 2 Nmm$^{-2}$, while Examples retained a bonding strength of 24 to 26 Nmm$^{-2}$, greater than 2 Nmm$^{-2}$, and were found to have a practical strength. Hence, it was found that high strength in high temperature was obtained as in the case of Examples described above even when the first metal was plated (coated) on the surface of the second metal.

For the remaining first metal component rate, Comparative Examples had a rate greater than 30% by volume, while Examples all had a rate of 0% by volume. For the solder runoff failure rate, Comparative Examples had a rate of 70% or greater while Examples all had a rate of 0%, and Examples were found to have high heat resistance even when the first metal was plated (coated) on the surface of the second metal.

Example 6

A powder of Sn-3Ag-0.5Cu was prepared as the first metal powder. The average particle size of the first metal powder was 25 μm.

A powder of a Cu-10Mn alloy was prepared as the second metal powder. The average particle size of the second metal powder was 15 μm.

As the flux, a flux with a resin added thereto and a flux with no resin added thereto were prepared.

As the flux with no resin added thereto, general flux A having a compounding ratio of rosin: 74% by weight, diethylene glycol monobutyl ether: 22% by weight, triethanolamine: 2% by weight and hydrogenated castor oil: 2% by weight was prepared.

For the flux with a resin added thereto, thermosetting resin-compounded flux B with a thermosetting resin and a curing agent added to the general flux A and thermoplastic resin-compounded flux C with a thermoplastic resin added to the general flux A were prepared.

Thermosetting resin-compounded flux B contains the flux A, the thermosetting resin (bisphenol A type epoxy resin) and the curing agent at the ratio described below.

Flux A: 30% by weight

Thermosetting resin: 40% by weight

Curing agent: 30% by weight

Thermoplastic resin-compounded flux C contains the flux A and the thermoplastic resin (polyamide resin) at the ratio described below.

Flux A: 30% by weight

Thermoplastic resin (polyamide resin): 70% by weight

Then, following solder pastes were prepared:

a solder paste incorporating the flux A with no resin added thereto at such a ratio that the ratio of the flux to the entire solder paste is 10% by weight;

a solder paste incorporating thermosetting resin-compounded flux B at such a ratio that the ratio of the flux to the entire solder paste is 25% by weight; and a solder paste incorporating thermoplastic resin-compounded flux C at such a ratio that the ratio of the flux to the entire solder paste is 25% by weight.

For these solder pastes, the bonding strength, the remaining first metal component rate and the solder runoff failure occurrence rate were measured to evaluate the characteristics in the same manner as in Example 1.

Table 6 shows the bonding strength of each joined body (room temperature, 260° C.), the remaining first metal component rate, the solder runoff failure rate and the evaluation results thereof.

TABLE 6

| | First metal component (60% by volume) | Second metal component (40% by volume) | Presence/ absence of resin in flux | Evaluation of bonding strength (room temperature) | | Evaluation of bonding strength (260° C.) | | Evaluation of remaining components | | | |
|---|---|---|---|---|---|---|---|---|---|---|---|
| | | | | | | | | Remaining first metal component | | Evaluation of runoff | |
| | | | | Bonding strength (Nmm$^{-2}$) | Evaluation | Bonding strength (Nmm$^{-2}$) | Evaluation | rate (% by volume) | Evaluation | Runoff failure rate (%) | Evaluation |
| Example | Sn-3Ag-0.5Cu | Cu-10Mn | Present (bisphenol A epoxy resin) | 35 | ⊙ | 33 | ⊙ | 0 | ⊙ | 0 | ⊙ |
| | | | Present (polyamide resin) | 32 | ⊙ | 30 | ⊙ | 0 | ⊙ | 0 | ⊙ |
| | | | Absent | 28 | ⊙ | 24 | ⊙ | 0 | ⊙ | 0 | ⊙ |
| Comparative Example | Sn-3Ag-0.5Cu | Cu | — | 25 | ⊙ | 0.1 | X | 31 | X | 75 | X |

As shown in Table 6, for the bonding strength at room temperature, both Examples and Comparative Example showed a bonding strength of 20 Nmm$^{-2}$ or greater and were found to have a practical strength.

On the other hand, for the bonding strength at 260° C., Comparative Example had an insufficient bonding strength of 0.1 Nmm$^{-2}$, far below 2 Nmm$^{-2}$, while Examples retained a bonding strength of 24 to 33 Nmm$^{-2}$, greater than 2 Nmm$^{-2}$, and were found to have a practical strength.

For the remaining first metal component rate, Comparative Example had a rate greater than 30% by volume, while Examples all had a rate of 0% by volume. For the solder runoff failure rate, Comparative Examples had a rate of 70% or greater, while Examples all had a rate of 0%, and were found to have high heat resistance even when a resin was added.

In Examples described above, the present invention has been described taking as an example the case where the lattice constant of the intermetallic compound is greater than the lattice constant of the second metal, but theoretically, the present invention can also be constituted such that the lattice constant of the second metal is greater than the lattice constant of the intermetallic compound. In this case, by ensuring that the lattice constant difference is 50% or greater, diffusion of the first metal and the second metal rapidly proceeds, their change into an intermetallic compound having a higher melting point is facilitated, and almost no first metal component remains, thus making it possible to solder with increased strength in high temperature.

The present invention is not limited to Examples described above, and various modifications and changes can be made within the scope of the invention as to the type and composition of the first metal and the second metal constituting the solder paste, the compounding ratio of the first metal and the second metal, the components of the flux and the compounding ratio of the flux, and so on.

In addition, various modifications and changes can be made within the scope of the invention as to the type of an object to be joined using the present invention, conditions in the joining step, and so on.

In other respects, various modifications and changes can be made as well within the scope of the invention.

DESCRIPTION OF REFERENCE SYMBOLS 1 first metal
2 second metal
3 intermetallic compound
4 joint
11a, 11b a pair of electrodes (object to be joined)
10 solder paste

The invention claimed is:

1. A solder paste comprising:
a metal component comprising a first metal, a second metal having a melting point higher than that of the first metal, and a flux component, wherein
the first metal is one of Sn and an alloy containing Sn,
the second metal is one of (1) a Cu—Mn alloy in which a ratio of Mn to the second metal is 5 to 30% by weight and (2) a Cu—Ni alloy in which a ratio of Ni to the second metal is 5 to 20% by weight, and
a ratio of the second metal to the metal component is 36.9% by volume or greater.

2. The solder paste according to claim 1, wherein the first metal is one of Sn alone and an alloy containing at least one material selected from the group consisting of Cu, Ni, Ag, Au, Sb, Zn, Bi, In, Ge, Al, Co, Mn, Fe, Cr, Mg, Pd, Si, Sr, Te, P and Sn.

3. The solder paste according to claim 1, wherein the second metal has a specific surface area of 0.05 m$^2 \cdot$g$^{-1}$ or greater.

4. The solder paste according to claim 1, wherein at least a portion of the first metal is coated on a circumference of the second metal.

5. The solder paste according to claim 1, wherein the flux contains at least one material selected from the group consisting of:
(a) at least one rosin material selected from a rosin group consisting of a rosin, a polymerized rosin, a water white rosin and a hydrogenated rosin;
(b) a rosin-based resin containing a derivative of at least one material selected from the rosin group; and
(c) a pasty matter containing a dissolved solid component and at least one solvent selected from the group consisting of ethylene glycol monobutyl ether, diethylene glycol monoethyl ether and diethylene glycol monobutyl ether.

6. The solder paste according to claim 5, wherein the dissolved solid component is a thixotropic agent or an activator.

7. The solder paste according to claim 1, wherein the flux contains one of (1) at least one material selected from a thermosetting resin group consisting of an epoxy resin, a phenol resin, a polyimide resin, a silicon resin, a derivative of the silicon resin, and an acryl resin, and (2) at least one material selected from a thermoplastic resin group consisting of a polyamide resin, a polystyrene resin, a polymethacryl resin, a polycarbonate resin and a cellulose resin.

8. The solder paste according to claim 1, wherein a concentration of oxygen in the first metal and the second metal is 2000 ppm or less.

9. The solder paste according to claim 8, wherein a concentration of oxygen in the first metal and the second metal is 10 to 1000 ppm.

10. A method of joining an object, the method comprising:
applying the solder paste according to claim 1 to the object to be joined; and
forming the first metal component into an intermetallic compound with the second metal by heating to join the object to be joined.

11. A joined structure comprising:

an object;

a solder joint in contact with the object, the solder joint being derived from the solder paste according to claim 1 and containing the second metal and an intermetallic compound containing the second metal and Sn, and represents 30% by volume or less of an entire metal component of the first metal.

12. The joined structure according to claim 11, wherein the intermetallic compound was formed between one of (1) the Cu—Mn alloy and the Cu—Ni alloy and (2) one of Sn alone and an alloy containing at least one material selected from the group consisting of Cu, Ni, Ag, Au, Sb, Zn, Bi, In, Ge, Al, Co, Mn, Fe, Cr, Mg, Pd, Si, Sr, Te and P and Sn.

* * * * *